(12) United States Patent
Hashimoto

(10) Patent No.: US 10,096,762 B2
(45) Date of Patent: Oct. 9, 2018

(54) GEL ACTUATOR AND METHOD FOR PRODUCING SAME

(71) Applicant: SHINSHU UNIVERSITY, Matsumoto, Nagano (JP)

(72) Inventor: Minoru Hashimoto, Nagano (JP)

(73) Assignee: Shinshu University, Matsumoto, Nagano (JP)

( * ) Notice: Subject to any disclaimer, the term of this patent is extended or adjusted under 35 U.S.C. 154(b) by 665 days.

(21) Appl. No.: 14/378,496

(22) PCT Filed: Feb. 12, 2013

(86) PCT No.: PCT/JP2013/053249
§ 371 (c)(1),
(2) Date: Aug. 13, 2014

(87) PCT Pub. No.: WO2013/122047
PCT Pub. Date: Aug. 22, 2013

(65) Prior Publication Data
US 2015/0171305 A1    Jun. 18, 2015

(30) Foreign Application Priority Data
Feb. 14, 2012    (JP) .................................. 2012-29010

(51) Int. Cl.
*H01L 41/04*    (2006.01)
*H01L 41/193*    (2006.01)
(Continued)

(52) U.S. Cl.
CPC ........ *H01L 41/0471* (2013.01); *H01L 41/083* (2013.01); *H01L 41/193* (2013.01);
(Continued)

(58) Field of Classification Search
CPC .... H01L 41/047; H01L 41/083; H01L 41/193
(Continued)

(56) References Cited

U.S. PATENT DOCUMENTS 4,701,659 A * 10/1987 Fujii .................... B06B 1/0688
310/334
5,977,685 A * 11/1999 Kurita .................... C08G 18/10
310/311
(Continued)

FOREIGN PATENT DOCUMENTS

JP    02-041685 A    2/1990
JP    08-033361 A    2/1996
(Continued)

OTHER PUBLICATIONS

International Search Report of PCT/JP2013/053249, dated May 14, 2013.
(Continued)

*Primary Examiner* — Derek Rosenau
(74) *Attorney, Agent, or Firm* — Collard & Roe, P.C.

(57) ABSTRACT

Provided is a gel actuator having generation force comparable to biological muscle at a low voltage, that can be used in various applications as an actuator element. A gel actuator (10) comprises a unit structure composed of a gel layer (14) containing a dielectric polymer material, and an anode (12) and a cathode (16) which sandwich the gel layer (14) in a thickness direction thereof, and a face of the anode (12) facing the gel layer formed into a concave-convex face, a convex part of the concave-convex face touching the gel layer (14), and a concave part thereof being into a gap.

6 Claims, 10 Drawing Sheets

(51) Int. Cl.
*H01L 41/047* (2006.01)
*H01L 41/083* (2006.01)
*H01L 41/27* (2013.01)
*H01L 41/297* (2013.01)

(52) U.S. Cl.
CPC ............ *H01L 41/27* (2013.01); *H01L 41/297* (2013.01); *Y10T 29/49117* (2015.01)

(58) Field of Classification Search
USPC ........................................ 310/365, 366, 800
See application file for complete search history.

(56) References Cited

U.S. PATENT DOCUMENTS

2008/0226878 A1    9/2008  Benslimane et al.
2009/0127979 A1*   5/2009  Takeuchi ............ H01L 41/0836
                                                         310/328

FOREIGN PATENT DOCUMENTS

| JP | 2007-118159 A | 5/2007 |
| JP | 2009-189220 A | 8/2009 |
| JP | 2009-273204 A | 11/2009 |
| JP | 2010-016969 A | 1/2010 |
| WO | 2004/026758 A1 | 4/2004 |

OTHER PUBLICATIONS

Katsuya Fujii et al., Polymer Preprints, Influence of the Plasticizer on the Electrical Deformation of PVC Gel, 2006, vol. 55, No. 2, pp. 4557-4558.
Misaki Yamano et al., Journal of the Robotics Society of Japan, Structure and Characteristics of a Contraction Type PVC Gel Actuator, 2009, vol. 27, No. 7, pp. 16-22.
Naoki Ogawa et al., International Conference on Intelligent Robots and Systems, Characteristics Evaluation of PVC Gel Actuators, 2009, pp. 2898-2903.
Minoru Hashimoto et al., Journal of the Robotics Society of Japan, Development of a Negative Type Polymer Brake Using a Contraction Type PVC Gel Actuator, 2011, vol. 29, No. 8, pp. 667-674.
Biso Maurizio et al: "Linear and bending actuation of bucky gel", Electroactive Polymer Actuators and devices (EAPAD) 2011, SPIE, 1000 20th St. Bellingham WA 98225-6705 USA, vol. 7976, No. I, Mar. 24, 2011 (Mar. 24, 2011), pp. 1-6, XP060008868, DOI: 10.1117/12.878464 [retrieved on Mar. 28, 2011].
Xia H et al: "Actuation mechanism of plasticized PVC by electric field", Sensors and Actuators A, Elsevier Sequoia S.A., Lausanne, CH, vol. 157, No. 2, Feb. 1, 2010 (Feb. 1, 2010), pp. 307-312, XP026881711, ISSN: 0924-4247, DOI: 10.1016/J.SNA.2009.11.028 [retrieved on Dec. 11, 2009].
Extended European Search Report dated Sep. 29, 2015 in European Application No. 13749148.6.

* cited by examiner (a)

(b)

(a)

(b)

(c)

(d)

(a)

(b)

(c)

GEL ACTUATOR AND METHOD FOR PRODUCING SAME

CROSS REFERENCE TO RELATED APPLICATIONS

This application is the National Stage of PCT/JP2013/053249 filed on Feb. 12, 2013, which claims priority under 35 U.S.C. § 119 of Japanese Application No. 2012-29010 filed on Feb. 14, 2012, the disclosures of which are incorporated by reference. The international application under PCT article 21(2) was not published in English.

TECHNICAL FIELD

The present invention relates to a gel actuator which may be used to various mechanical systems including a robot, and a method for producing the same.

Various mechanical systems including a robot used in the fields of medical and welfare are required to have compatibility and safety for human. Therefore, development of a next-generation actuator which satisfies such needs is desired. Many studies have been conducted especially on an actuator which is employed with a polymer material because such actuator has advantages of being soft as biological muscle of human and reduced in size and weight while having high energy efficiency. However, many of polymer actuators are a model that drives or bends and deforms only in a solution (Patent Document 1), and a polymer actuator which expands or contracts in the atmosphere as biological muscle is very few.

It is known that a polyvinyl chloride gel of which polyvinyl chloride (PVC) as one of the polymer materials is gelled by a plasticizer, creep-deforms at neighbourhood area of an anode, and has high stretch ratio and high responsibility in the atmosphere (Non Patent Document 1). The inventors of the present invention focused on an electric field driving characteristics of the PVC gel and developed a soft actuator which drives and contracts in the atmosphere. In the soft actuator, an electrode in a mesh texture shape is employed as an anode, and PVC gel is sandwiched between the electrodes to be stuck together (Non Patent Document 2). Furthermore, the characteristic of the soft actuator is presented (Non Patent Document 3), and the modelization and control regulation of the soft actuator has been studied. In addition to that, the inventors of the present invention have developed a negative type polymer brake utilizing the principle presented in the above-mentioned documents (Non Patent Document 4).

According to these series of studies, the actuator has characteristics of a displacement ratio of 10%, a generation force of 400 Pa/Layer and a responsiveness of 7 Hz when a voltage of 600V is applied. These studies suggest feasibility to drive such actuator to expand and contract in the atmosphere with low power consumption. Such actuator has characteristics similar to biological muscle where stiffness is increased by an applied electric filed, and also it can control a displacement accurately by a feedback control. Moreover, it is also revealed that such actuator may be treated as one of the control components.

PRIOR ART DOCUMENT

Patent Document

[Patent Document 1] JP Patent Application Publication No. 2009-273204A

Non Patent Document

[Non Patent Document 1] Katuya Fujii, Takafumi Ogiwara, Toshihiro Hirai, Ken Kinoshita, "Influence of the plasticizer on the creep-deformation of PVC gel", Polymer Preprints, Japan, vol. 55, No. 2, pp. 4557-4558, 2006

[Non Patent Document 2] Misaki Yamano, Naoki Ogawa, Minoru Hashimoto, Midori Takasaki, Toshihiro Hirai "Structure and Characteristics of a Contraction Type PVC Gel Actuator", Journal of the Robotics Society of Japan, Vol. 27, No. 7, pp. 718-724, 2009

[Non Patent Document 3] Naoki Ogawa, Minoru Hashimoto, Midori Takasaki, Toshihiro Hirai, "Characteristics Evaluation of PVC Gel Actuators", The 2009 IEEE/RS International Conference on Intelligent Robots and Systems (IROS2009), St. Louis, USA, pp. 2898-2903, 2009

[Non Patent Document 4] Minoru Hashimoto, Minami Shibagaki, Toshihiro Hirai, "Development of a Negative Type Brake Using a Contraction Type PVC Gel Actuator", Journal of the Robotics Society of Japan, Vol. 29, No. 8, pp. 667-674, 2011

SUMMARY OF THE INVENTION

Problems to be Solved by the Invention

Incidentally, it is known that biological muscle has characteristics of displacement ratio of 30%, generation force of 300 kPa, and responsive characteristics of 10 Hz. In order to use the polymer gel actuator in the fields of medical and welfare etc., increase of generation force and decrease of applied voltage to improve safety are required. The present invention was made in view of solving the above described problems, and its object is to provide a gel actuator that has characteristics of a generation force etc. comparable with biological muscle in low voltage and is usable in wider uses as an actuator element by downsizing thereof, and a method for producing the same.

Means for Solving Problems

A gel actuator of the present invention comprises a unit structure composed of a gel layer containing a dielectric polymer material, and an anode and a cathode which sandwich the gel layer in a thickness direction thereof wherein a face of the anode facing the gel layer is formed into a concave-convex face, a convex part of the concave-convex face touches the gel layer, and a concave part thereof is formed into a gap. The anode formed into the concave-convex face may be in various shapes such as a cylindrical shape, a holey shape (i.e. discretely holed holes with bottoms or through-holes in a flat plate), a cuboidal shape, a mesh texture shape and a wave shape.

In the gel actuator, a plurality of the unit structure is preferably stacked so as to have a configuration avoiding an electrical short. It is preferable that the gel layers be provided with both faces of the anode, and the cathodes are stacked to the respective gel layers. In addition, it is further preferable that the gel layers be provided with both faces of the cathode, and the anodes are stacked to the respective gel layers.

The plane-face shape, height, depth, width, configuration distance etc. of the convex part and the concave part in the concave-convex face may be adjusted appropriately. The anode is preferably formed into a wave shape where the convex part and the concave part on one face of the anode respectively correspond to the concave part and the convex part on the other face thereof; and the convex part and the concave part are formed into a congruent shape. Thereby, the gel layer is provided with the both faces of the anodes so as to provide the gel actuator with a stacked structure. Incidentally, the convex parts and the concave parts formed into a congruent shape means that the convex parts on one face of the anode and the concave parts on the other face thereof have the same height and depth, and the configuration distance of the convex part and the convex part is the same.

In addition, as another structure of the anode, the anode may be composed of a base material which is made from a non-conductive material and has a concave-convex shape on one face thereof, and the surface of the concave-convex shape thereof is coated with a conductive layer. In this case, the anode, the gel layer and the cathode are stacked in this order to form the gel actuator.

The gel actuator performs contraction in the thickness direction, corresponding to ON-OFF of voltage which is applied between the anode and cathode. Namely, when voltage is applied between the anode and the cathode, electric charge which is injected into the gel from the cathode is accumulated in the anode side, and the gel creep-deforms so as to be absorbed in the anode. The gel actuator contracts in the thickness direction by the gel entered into the gap of the concave part of the anode formed into the concave-convex face. When voltage is deactivated, the gel actuator performs recovery to the original state due to the elasticity of the gel.

A contractive action of the gel actuator is generated by creep deformation of the gel. It is considered that the creep deformation is generated at several dozen of micrometers in the depth direction from the face of the gel touching the anode surface by interaction force. Electric charge density is increased near the gel surface, and the gel creeps out to the anode surface by negative electric charge and electrostatic attractive force of the anode. Thereby the creep deformation is generated. The electric charge density of neighborhood of the gel surface increases as an applied electric field increases, so when the electric field increases, the displacement amount increases. Therefore, when the thickness of the gel sandwiched between the anode and the cathode is thinned, even under equivalent applied voltage, the electric field (electric charge density distribution of the gel surface of the anode side) increases, and thus large creep deformation may be obtained.

That is to say, in the case of obtaining equivalent deformation amount, applied voltage may be decreased by thinning the thickness of the gel. Supposedly, if the thickness of the gel may be reduced to one-tenth, equivalent deformation amount is obtained even if the applied voltage is reduced by one digit. However, if the thickness of the gel is merely thinned by employing a mesh texture anode with the thickness of several hundreds micrometers, the gel completely enters into gap parts of the mesh texture anode, and the anode and cathode could short. Therefore, when the thickness of the gel is thinned, amount of the gap parts of the mesh needs to be reduced. Namely, by reducing the thicknesses of the gel and the anode, applied voltage may be decreased.

Additionally, generation force of the gel actuator is increased proportionately to a stack number of the unit structure of the actuator composed of the gel, and the anode and the cathode having a structure which sandwich the gel in the thickness direction thereof. When a gel actuator of the thickness stays unchanged, generation force of an actuator may be largely increased by thinning the thickness of the unit structure and increasing the stack number of the unit structures. For example, if the thickness of the unit structure is thinned from 3 mm to 30 μm, the stack number in the gel actuator is increased to 100 times, and thus generation force of the gel actuator may be increased to 100 times.

The gel actuator of the present invention has a composition of which the face of the anode touching (facing) the gel is formed into the concave-convex face. Thereby the concave-convex shape of the concave-convex face may be fined down by using means of finely forming a conductor, and a concave-convex structure of the anode may be easily structured to a fine structure with several micrometers to several dozen micrometers. In addition, a form of the concave-convex structure formed to the anode (height, depth, and a plain face layout pattern etc. of the convex part and the concave part) may be appropriately adjusted, and the gel actuator may be composed according to various uses. Further, the gel actuator may be formed as a multilayer stacked structure and may be reduced in size.

A method for producing a gel actuator of the present invention comprises a step of forming a face of the anode facing a gel layer into a concave-convex face to compose of a unit structure of the gel actuator including a gel layer containing a dielectric polymer material, and an anode and a cathode which sandwich the gel layer in a thickness direction thereof.

The method for producing the gel actuator may further comprise a step of forming a gel sheet by providing the gel layers on both faces of the cathode, and a step of stacking the anode to the gel sheet.

Effects of the Invention

The gel actuator of the present invention has the multilayer stacked structure, may be reduced in size, and may be provided as an actuator having required generation force which can be utilized.

MODE FOR CARRYING OUT THE INVENTION

Hereunder, embodiments to practice the present invention in detail will be explained, but the scope of the present invention is not restricted by these embodiments.

(Basic Structure of Gel Actuator)

Figure 1:
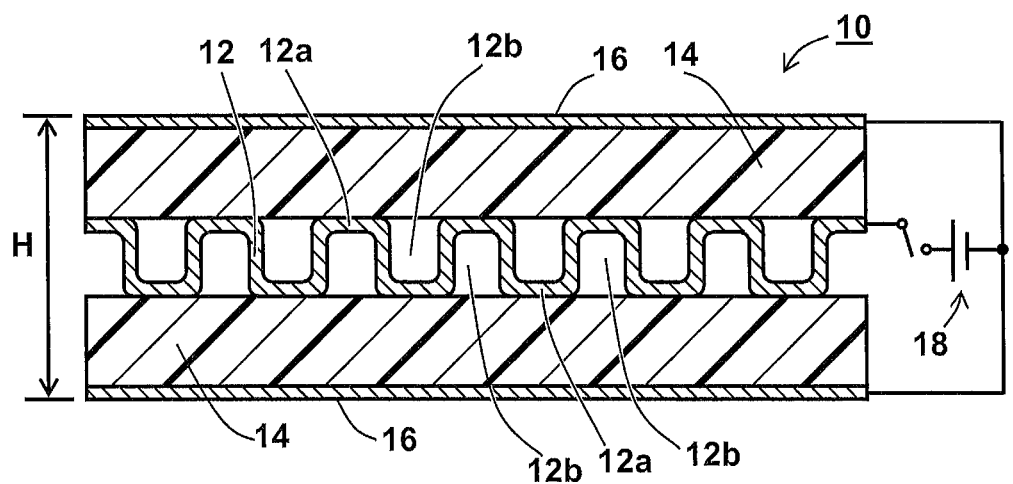
FIG. 1 is a cross-sectional view showing a basic structure of the gel actuator of the present invention and an action thereof.
Figure 1:
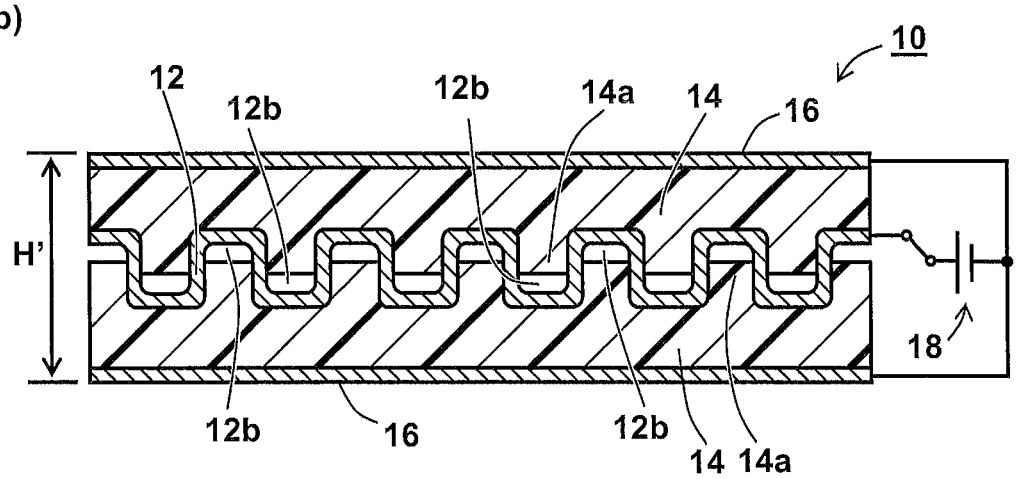

A basic structure of a gel actuator of the present invention is shown in FIG. 1 (a). The gel actuator 10 is composed of an anode 12 of which both faces are formed into a concave-convex face by employing a conductive material such as metal, the gel layers 14 containing a dielectric polymer material, which are configured to sandwich the anode 12 in a thickness direction and to be stacked to both faces of the anode 12, and cathodes 16 which coat outer faces of the gel layers 14 (the opposite face of faces touching the anode 12).

The gel layers 14 are formed into a flat film and stacked so as to bridge convex parts 12a of the anode 12. Thereby, parts of concave parts 12b between respective convex parts 12a are formed into gaps.

A unit structure of the gel actuator which performs an actuator action is composed of the single gel layer 14, the anode 12 and the cathode 16 sandwiching the gel layer 14 in the thickness direction thereof. Namely, the unit structure thereof is composed of "the anode 12, the gel layer 14 and the cathode 16". When a plurality of the unit structures is stacked to the same direction, the unit structures are lined in order of "the anode 12, the gel layer 14 and the cathode 16", "the anode 12, the gel layer 14 and the cathode 16" . . . . In this case, due to the unit structures lined next to each other, the anode 12 and the cathode 16 electrically short. The basic structure of the gel actuator shown in FIG. 1(a) is composed of the two unit structures which are stacked to each other in reverse direction while sharing the anode 12. According to such configuration, in the basic structure, an electric short between the two unit structures is avoided. In the basic structure of the gel actuator, because the anode 12 is shared between the two unit structures, the-thickness of the actuator is thinned compared to an actuator comprising two unit structures stacked in reverse direction.

Figure 2:
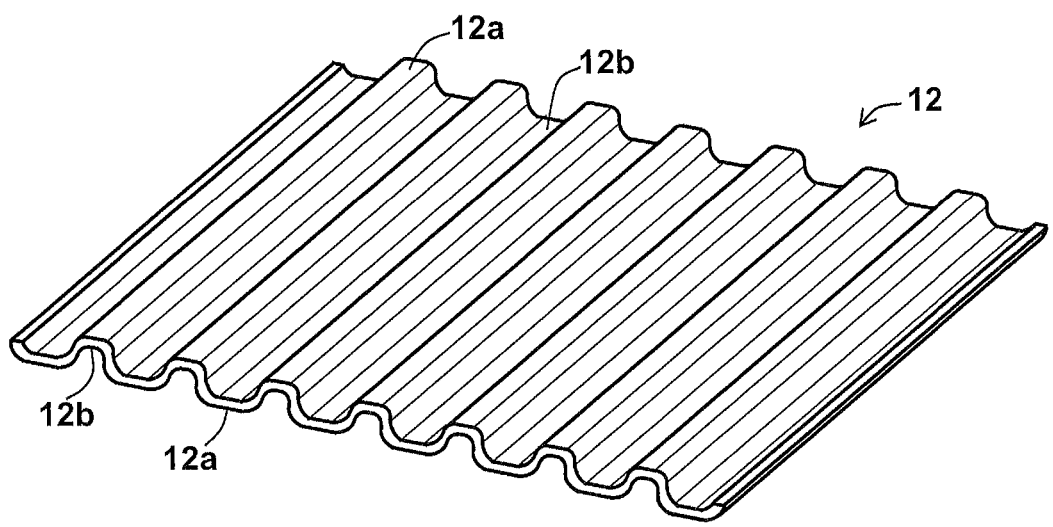
FIG. 2 is an outside view showing an anode used for the gel actuator of the present invention.

In the embodiment, the anode 12 is formed into a wave shape where the convex parts 12a and the concave parts 12b are alternately continuous in parallel. The anode may be formed into another shape such as configuring numerous fine cylinders as the convex parts. An outside view of the anode 12 of the embodiment is shown in FIG. 2. The convex parts 12a and the concave parts 12b on one face of the anode 12 respectively correspond to the concave parts 12b and the convex parts 12a on the other face thereof. The convex parts 12a and the concave parts 12b are respectively formed into a congruent shape (Height, depth and width of both parts 12a, 12b have mutually same values.).

The actuator action of the gel actuator 10 is generated corresponding to an action of which gel of the gel layers 14 enters into the gaps of the concave parts 12b of the concave-convex shape formed on the surface of the anode 12. Therefore, when the actuator action is considered, the width, depth, configuration distance etc. of the concave parts 12b formed on the surfaces of the anode 12 need to be adjusted appropriately.

The dielectric polymer material contained in the gel layers 14 as a principal component is a material which generates bent deformation or creep deformation by activating electric field. For example, polyvinyl chloride (PVC), polymethyl methacrylate, polyurethane, polystyrene, polyvinyl acetate, nylon 6, polyvinyl alcohol, polycarbonate, polyethylene terephthalate, poly acrylonitrile, silicone rubber and the like are included as such dielectric polymer material. The gel layers 14 contain the dielectric polymer material and a plasticizer for the dielectric polymer material to be gelled. The gel layers 14 may contain another plasticizer if needed. When the dielectric polymer material has enough deformation characteristics by the electric field, the gel layers 14 may be made from only the dielectric polymer material.

The cathodes 16 are intended for applying voltage to the gel layers 14 in between the anode 12. In order to apply the electric field throughout a whole area of the gel layers 14, the cathodes 16 are provided so as to coat the whole area of the gel layers 14. The electric field need to be applied to the gel layers 14 approximately evenly, and the cathodes 16 may not necessarily formed into a complete blanket film but may be formed into a mesh texture shape.

A state of applying voltage between the anode 12 and cathodes 16 is shown in FIG. 1(b). When voltage is applied between the anode 12 and the cathodes 16, electric charge is injected into the gel layers 14 from the cathodes 16, and electric charge is accumulated near the anode 12. Then, the gel of the gel layers 14 is creep-deformed and enters into the gaps of the concave parts 12b of the anode 12. The gel layers 14 are contracted in the thickness direction thereof by the gel entered into the gaps of the concave parts 12b. Namely, based on a total thickness H of the gel actuator 10 in FIG. 1(a), a total thickness H' of the gel actuator in FIG. 1(b) has relation of H'<H. By the both faces of the anode 12 respectively formed into the concave-convex face, both faces of the anode 12 act to the gel layers 14, and thus the gel actuator 10 has the structure which performs an efficient contractive action as the gel actuator. The gaps of the concave parts 12b may be filled by the gel which entered therein and push out the air in the gaps.

When voltage which is applied between the anode 12 and the cathodes 16 is switched to OFF, the gel layers 14 are recovered to a flat state before applying voltage (the state shown in FIG. 1 (a)) by elasticity of the gel itself. Therefore, by repeatedly conducting ON-OFF operation of voltage which is applied between the anode 12 and the cathodes 16, a contractive operation of the gel actuator 10 may be repeatedly conducted.

(Multilayer Structure of Gel Actuator)

Figure 3:
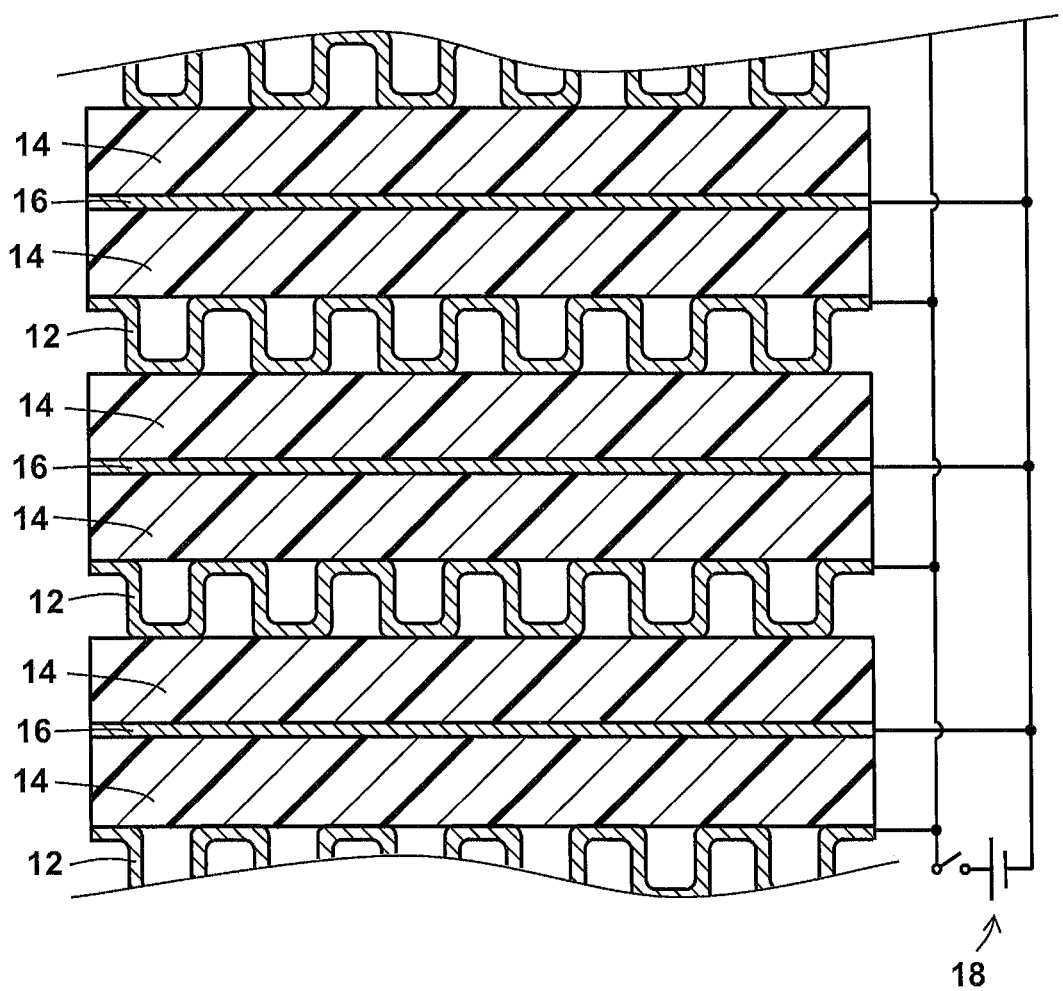
FIG. 3 is a cross-sectional view showing the stacked gel actuator of the present invention.

A multilayer structure of the gel actuator is shown in FIG. 3. Even if the gel actuator has only the unit structure, the gel actuator performs the actuator action (a contraction-recovery action in the thickness direction). With the basic structure of stacking two layers of a unit structure as shown in FIG. 1, the actuator action may be increased by double. As shown in FIG. 3, the unit structure which performs the actuator action is stacked in multilayer so as to obtain larger contraction amount and generation force.

When the gel actuator is formed into the multilayer structure, the gel actuator is formed into a configuration of which the anodes 12 are sandwiched between the gel layers 14 and the cathodes 16. The gel layers 14 and the cathodes 16 are configured on both faces of the anode 12 in FIG. 1. However, in the embodiment of FIG. 3, the multilayered structure of the gel actuator is composed: the anodes 12 are stacked on the gel layers 14 provided on the both faces of the cathodes 16, respectively. The gel layers 14 and the anodes 12 sandwich the cathodes 16, so as to provide a symmetric configuration on the basis of the cathodes 16. The stacked anodes 12 and the cathodes 16 are connected to a positive electrode and a negative electrode of a power source 18, respectively.

Incidentally, in the embodiment shown in FIG. 3, in order to avoid the electric short between the unit structures, the plurality of the unit structures is stacked sequentially in a reverse direction. The unit structures next to each other share the cathodes 16 and anodes 12.

Figure 4:
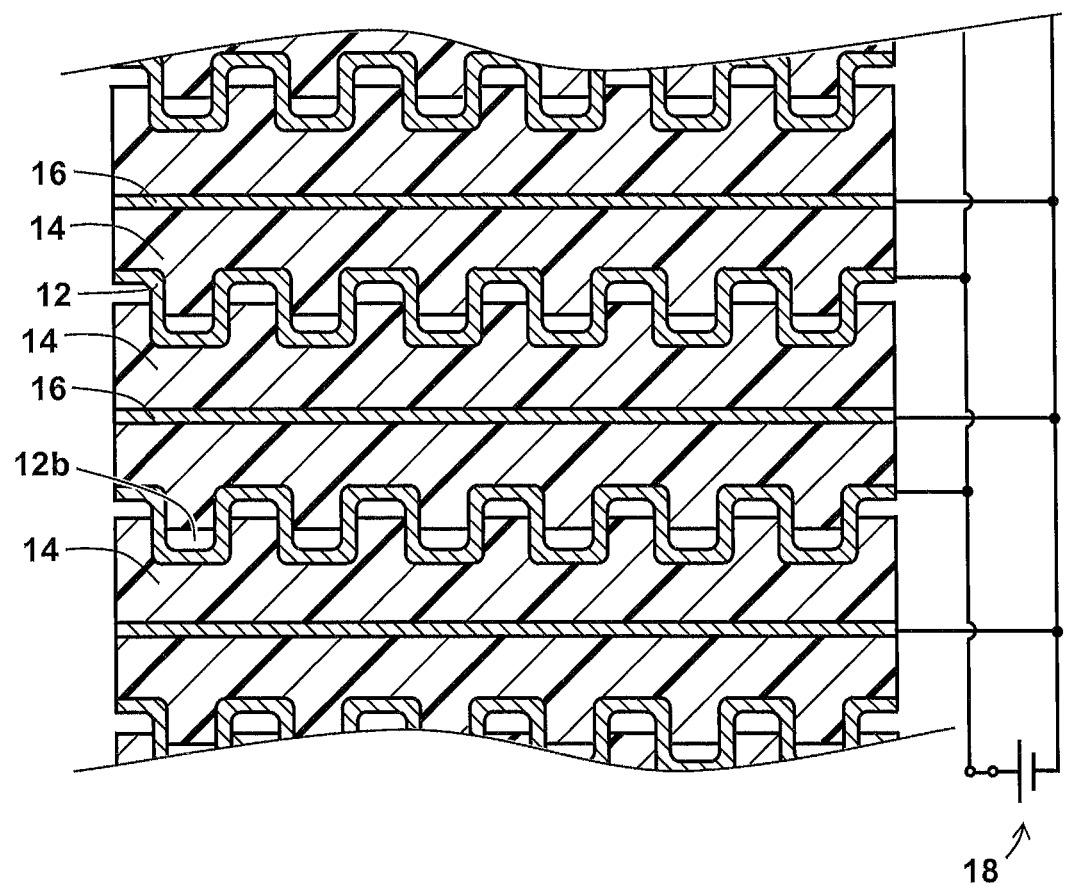
FIG. 4 is a cross-sectional view showing the action of the stacked gel actuator.

A state where voltage is applied to the anodes 12 and the cathodes 16 of the gel actuator formed into a stacked structure is shown in FIG. 4. By applying voltage, the gel of the gel layers 14 is creep-deformed, the gel enters into the gaps of the concave parts 12b of the anodes 12, and the gel actuator is contracted in the thickness direction thereof. With the both faces of the anodes 12 respectively formed into the concave-convex face, the both faces of the anodes 12 act to the gel layers 14. Therefore, the gel actuator has the structure which performs the efficient contractive action as the multilayer type gel actuator.

A contraction amount as the whole gel actuator which is formed by alternately stacking the anodes 12, the gel layers 14 and the cathodes 16 is the sum of contraction amount of each of the gel layers 14. Therefore, contraction amount of the gel actuator (deformation amount in the thickness direction) increases proportionately as a number of the stacked layers. In addition, generation force by the gel actuator having the stacked structure is the sum of generation force based on each of the gel layers 14. Thus, in order to obtain larger contraction amount or actuator force, the number of the stacked gel actuator need to be increased.

(Another Composition Example of Gel Actuator)

Figure 5:
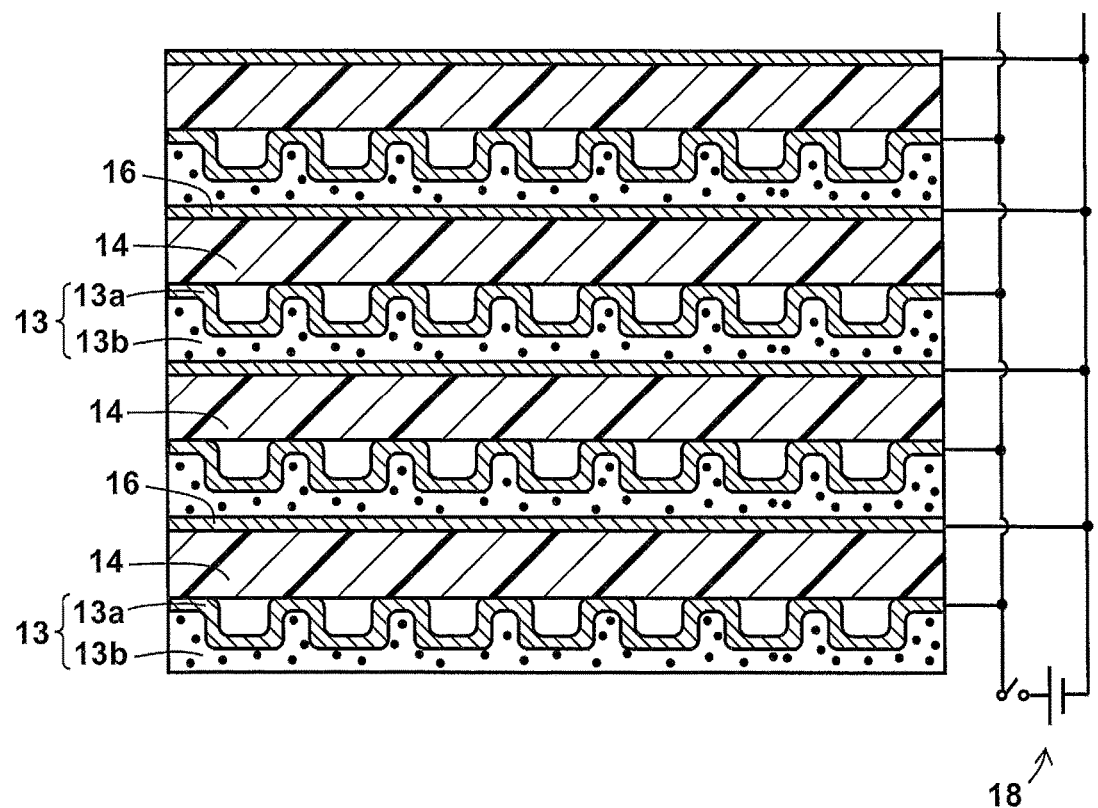
FIG. 5 is a cross-sectional view showing another example of the stacked gel actuator.

Another composition example of the multilayered type gel actuator is shown in FIG. 5. Similar to the before-described embodiments, the gel layers 14 in this embodiment are configured so as to be sandwiched by anodes 13 and the cathodes 16 in the thickness direction thereof, and surfaces of the anodes 13 touching the gel layers 14 are formed into a concave-convex face. However, whereas the both faces of the anodes 12 respectively have the concave-convex face in the previously described embodiment, in this embodiment, one face of base materials 13b with non-conductive property has the concave-convex shape and the surfaces of the concave-convex shape are coated by conductive layers 13a so as to prepare one face of the anodes 13 are formed into the concave-convex face. Incidentally, the anode may be composed by another shape such as configuring numerous fine cylinders corresponding to the convex parts.

The unit structure which performs the actuator action is a composition part where the gel layer 14 is sandwiched by the anode 13 and the cathode 16. The multilayer type gel actuator is composed of stacking the gel layers 14 and the cathodes 16 on the anodes 13 in this order. The anodes 13 and the cathodes 16 are respectively connected to the positive electrode and the negative electrode of the power source 18, and voltage is applied therebetween. In the composition example, the plurality of the unit structures is stacked in the same direction, but since the non-conductive base materials 13b is provided between the unit structures of next to each other, the electric short between the unit structures is avoided.

Figure 6:
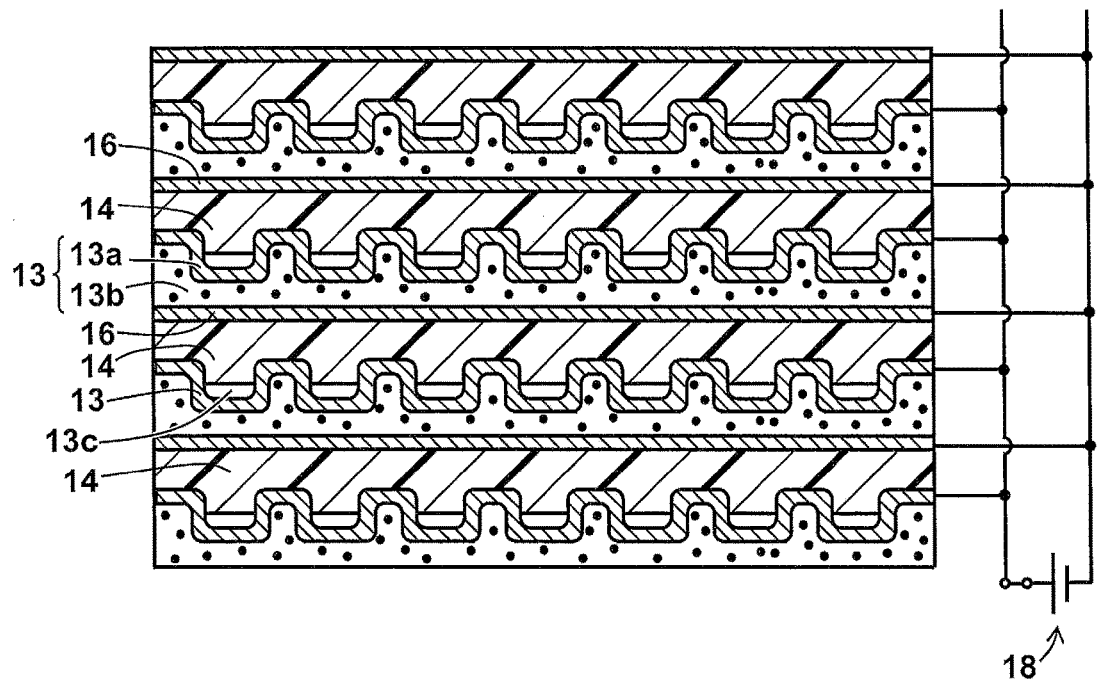
FIG. 6 is a cross-sectional view showing an action of the stacked gel actuator.

A state of applying voltage between the anodes 13 and the cathodes 16 of the gel actuator shown in FIG. 5 is shown in FIG. 6. By applying voltage, gel of the gel layers 14 is attracted to the convex parts of the anodes 13, the gel is partially entered into gaps of concave parts 13c of the anodes 13, the gel layers 14 are contracted in the thickness direction, and the contractive action of the gel actuator is generated.

Similar to the previously described embodiment of the gel actuator, the contraction-recovery action of the gel layers 14 corresponding to ON-OFF operation of applying voltage is a reversible action and may be repeated. Therefore, the multilayer type gel actuator shown in FIGS. 5 and 6 may be utilized as a preferred actuator.

In the gel actuators shown in FIGS. 1 and 3, the both faces of the anode 12 are formed into the concave-convex face respectively, and the contractive action of the gel is utilized at the both faces of the anode 12. In the embodiment, the only one face of the anode 13 is utilized for the contractive action of the gel, and when the only one face of anode is formed into the concave-convex face, there is an advantage that a setting distance, depth and the like of convex part and concave part in the concave-convex part may be arbitrarily designed while considering creep deformability of a gel, ability of entry into concave part of the gel and the like. Additionally, there is an advantage that by the base materials 13b made from the non-conductive material such as a cycloolefin polymer (COP) are performed as a support material (a support film) of the conductive layers 13a, finely forming of a concave-convex pattern become easy.

(Method for Producing of Gel Actuator)

When the multilayer type gel actuator is formed, thinning the thicknesses of the anode and the gel layer etc. are the main requirements to increase the stack number and downsize the gel actuator. In case of such gel actuator of the present invention, when the contractive action of the gel layer is utilized by forming the surface of the anode facing the gel layer into the concave-convex face and the thicknesses of the anode or the gel layer are merely thinned, the anode and the cathode could electrically short when the gel is entered into the concave part of the anode by creep deformation. In order to avoid the problem, the anode needs to be thinner, and the concave-convex pattern formed to the anode needs to be formed corresponding to the thickness of the gel layer so that when the gel is deformed with creep, the anode and cathode do not electrically short.

In the gel actuator of the present invention, it is supposed that the thicknesses of the anode and the gel layer to be set to micrometer order. When the thicknesses of the anode and the gel layer are set to micrometer order, the concave-convex pattern formed to the anode needs to be form finely with accuracy of micrometer order or less. In the fields of producing of electronic parts etc., various methods are performed as a method for forming a fine pattern. When the gel actuator of the present invention is produced, conventional methods for forming of the fine pattern may be employed. An example of the method for producing the gel actuator is explained as follows.

<Forming Step of Anode>

Figure 7:
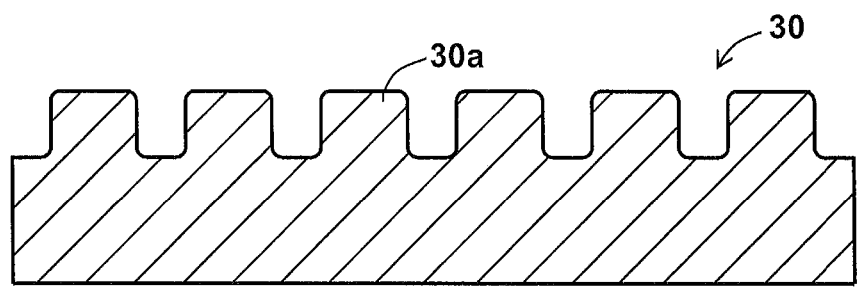
FIG. 7 is a figure showing the method for producing the anode used for to the gel actuator of the present invention.
Figure 7:
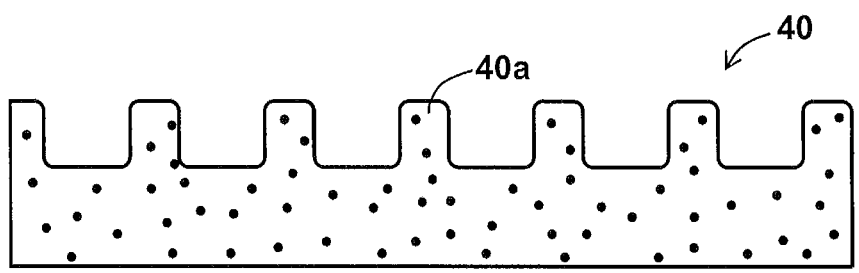
Figure 7:
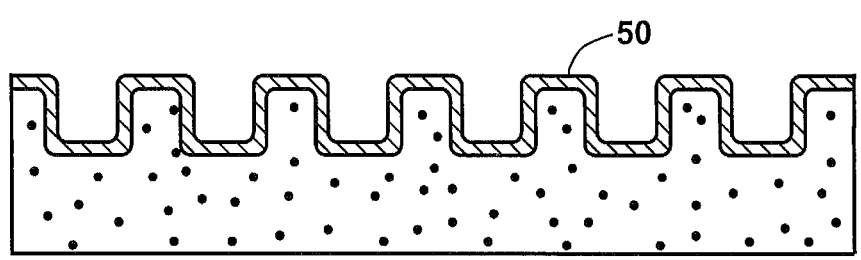
Figure 7:
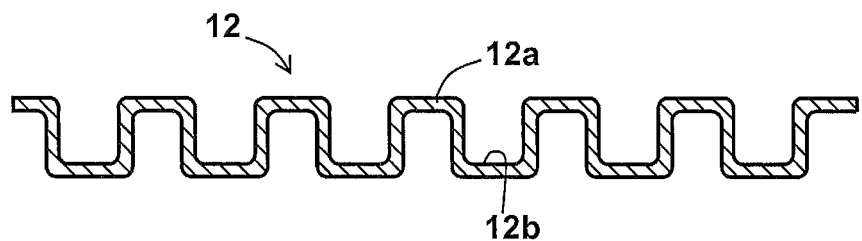

A producing example of the anode of which the both faces are formed into the concave-convex face respectively is shown in FIG. 7. First, a substrate 30 is formed into a concave-convex along the concave-convex pattern of the anode (FIG. 7(a)). A resist pattern which covers a residual part on a surface of the substrate 30 as convex parts is formed to the substrate 30 by a photolithography method. The surface of the substrate 30 is etched by using the resist pattern as a protection film. Thereby, a concave-convex pattern 30a is formed to the surface of the substrate 30. Corresponding to a material employed to the substrate 30, the chemical etching or the physical etching such as RIE (Reactive Ion Etching) etc. may be selected. According to the photolithography method, forming of the concave-convex pattern 30a with accuracy of several micrometers to several dozen micrometers is easy. As substrate 30, an appropriate material such as a silicon substrate, a glass plate, a metal plate and the like suitable for forming a fine pattern is employed.

Next, an operation which transfers the concave-convex pattern of the substrate 30 to a resin (a polymer material) is conducted. The resin for transfer is fed to a concave-convex face of the substrate 30. The resin is cured while alternately pressuring the substrate 30 and the resin. Thereby the concave-convex pattern is transferred to the resin. The resin may be cured by a method such as a thermal curing method, a method using the ultraviolet curable resin to which an ultraviolet ray is irradiated. A transfer substrate 40 obtained by transferring the concave-convex pattern from the substrate 30 is shown in FIG. 7(*b*).

Then, a conductor layer 50 is formed to the face of a transfer substrate 40 to which a concave-convex pattern 40*a* is formed (FIG. 7(*c*)). In order to correspond to the concave-convex pattern 40*a* formed to the transfer substrate 40, the conductor layer 50 is provided so as to cover convex parts, concave parts and inner side faces of the concave parts of the concave-convex pattern 40*a* respectively. The conductor layer 50 may be formed into a specified thickness by employing a plating method, a sputtering method and the like. In the embodiment, both faces of an anode are formed into a congruent wave shape, so a concave-convex shape of the transfer substrate 40 and a thickness of the conductor layer 50 are controlled so as to obtain the wave shape. As a conductor material for the conductor layer 50, nickel, copper and various alloy materials are employed. Incidentally, the conductor layer 50 is not restricted to be formed in a single layer, but may be formed into a plurality of layers, for example, a nickel layer as a base material and gold as a surface layer.

After the conductor layer 50 is formed to the surface of the transfer substrate 40, the anode 12 is obtained by chemically dissolving and removing the transfer substrate 40 (FIG. 7(*d*)). When the transfer substrate 40 is dissolved and removed, a solvent which may selectively dissolve the only transfer substrate 40 is employed. Therefore, materials of the conductor layer 50 and the transfer substrate 40 need to be selected so that the transfer substrate 40 may be selectively dissolved and removed. The obtained anode 12 is employed as a member to form the multilayer type gel actuator and is stacked with the gel layer 14 etc.

<Forming Step of Gel Sheet>

Figure 8:
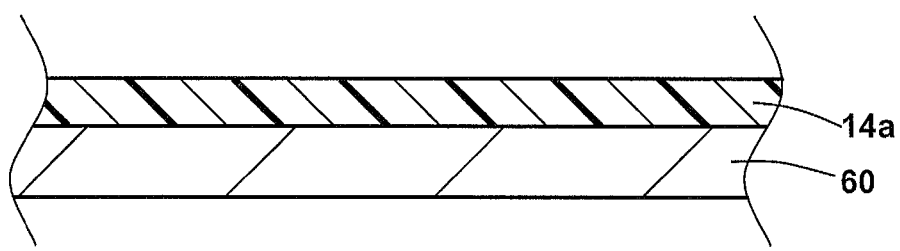
FIG. 8 is a figure showing the method for producing a gel sheet used for the gel actuator of the present invention.
Figure 8:
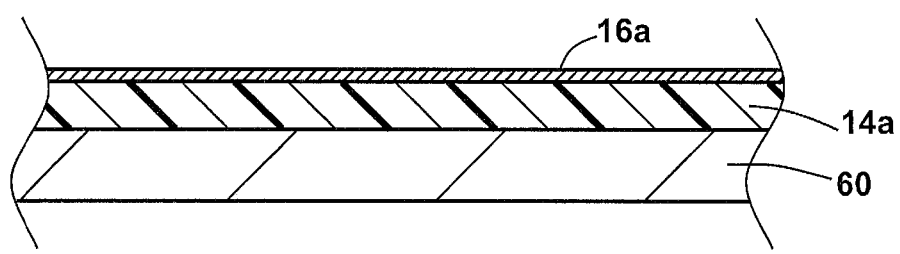
Figure 8:
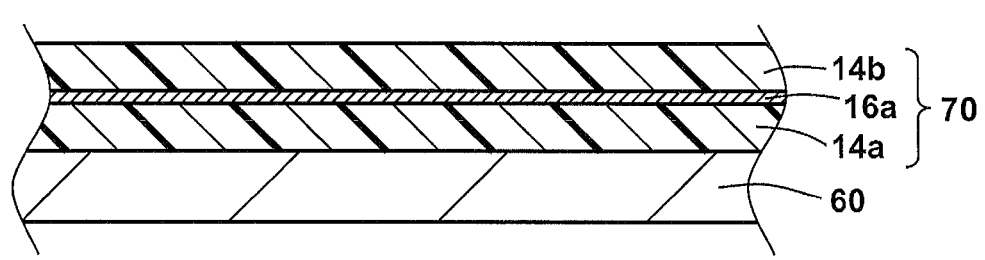

A method for producing a gel sheet 70 which is employed for producing the gel actuator is shown in FIG. 8. A state of a gel layer 14*a* provided onto a release sheet 60 is shown in FIG. 8(*a*). The gel layer 14*a* may be obtained by coating a gel solution obtained by dissolving a dielectric polymer material such as polyvinyl chloride etc. in a solvent and then vaporizing the solvent. The thickness of the gel layer 14*a* may be controlled to the thickness of approximately 10 to 100 μm depending on coating methods.

In case of employing polyvinyl chloride as the dielectric polymer material, as a plasticizer, dibutyl adipate (DBA) is added to polyvinyl chloride, and a gel solution is prepared by employing tetrahydrofuran (THF) as a solvent. A gel layer is formed by coating the gel solution. As the plasticizer other than DBA, for example, dimethyl adipate (DEA), bis phthalate (BSP), dibutyl phthalate (DBP) and the like are exemplified. The gel layer is a main composition part of the actuator which performs a contractive deformation by creep deformation, and performs an electric insulative action between the anode and the cathode by intervening therebetween. Thus, the gel layer needs to be evenly formed to a surface of the release sheet 60 so that a pinhole etc. is not formed.

A state of a conductor layer 16*a* formed to the surface of the gel layer 14*a* to be the cathode 16 is shown in FIG. 8(*b*). The conductor layer 16*a* may be formed by employing a film-forming method such as sputtering, plating or the like of metal such as copper, gold etc. A state of forming further a gel layer 14*b* onto a surface of the conductor layer 16*a* is shown in FIG. 8(*c*). The gel layer 14*b* may also be formed by a coating method of gel solution. Thus, a gel sheet 70 which is provided with the gel layers 14*a*, 14*b* on both faces of the conductor layer 16*a* is formed on the release sheet 60.

<Stacking Step of Anode and Gel Sheet>

The multilayer type gel actuator shown in FIG. 3 may be formed by alternately stacking the anode 12 shown in FIG. 7 and the gel sheet 70 shown in FIG. 8. The gel sheet 70 is supported by the release sheet 60, and the release sheet 60 may be released after the gel sheet 70 is stack on the anode 12. Therefore, the multilayer type gel actuator may be formed by alternatively stacking the anode 12 and the gel sheet 70. The stack number of the anode 12 and the gel sheet 70 may be appropriately adjusted. Therefore, the gel actuator having the optional stack number is obtained by selecting the repeated stack number.

In case of producing the gel actuator shown in FIG. 5, a member in which the conductor layer 50 is formed on the concave-convex face of the transfer substrate 40 shown in FIG. 7(*c*) and a member in which the gel layer 14*a* and the conductor layer 16*a* are formed on the release sheet 60 shown in FIG. 8 are stacked alternately. In this case, the transfer substrate 40 is integrated into the gel actuator as a stacked structure body. Therefore, appropriate material which composes the gel actuator is selected as a material of the transfer substrate 40.

(Another Method for Producing of Gel Actuator)

The method for producing the gel actuator is not restricted to the embodiments described above. In the step of producing the gel actuator shown in FIG. 7, it includes the method of forming the concave-convex pattern to the substrate 30, and transferring the concave-convex pattern from the substrate 30 to the transfer substrate 40. However, the step of producing it is not necessarily restricted to the method. In addition, in the embodiments described above, the example of which the surface of the anode facing the gel layer is formed into the concave-convex face of the wave shape is explained. However, as described below, the gel actuator having the stacked structure may also be formed by using a method of which the conductor pattern is formed into a discrete pattern of a mesh texture etc. on the surface of the gel layer.

Figure 9:
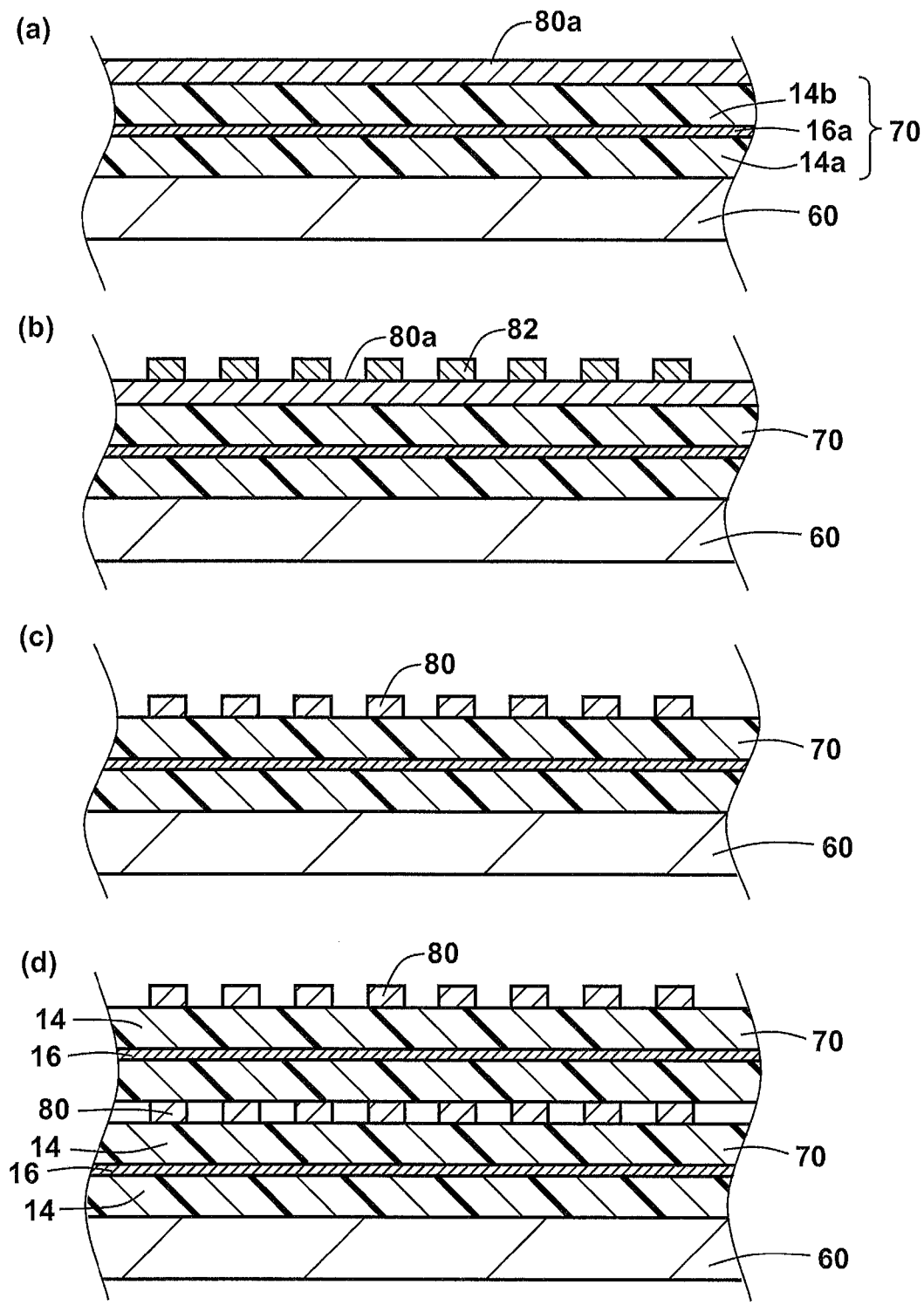
FIG. 9 is a figure showing another method for producing the gel actuator of the present invention.

A state of forming a conductor layer 80*a* to be an anode to a surface of a gel sheet 70 supported by a release sheet 60 is shown in FIG. 9(*a*). The conductor layer 80*a* may be formed to the specified thickness by employing the plating method, the sputtering method and the like.

A state of forming a resist pattern 82 by the photolithography method is shown in FIG. 9(*b*). The resist pattern 82 is corresponded to a pattern of anodes 80 which should be formed to the surface of the conductor layer 80*a*. The conductor layer 80*a* is etched by using the resist pattern 82 as a protection film, the resist pattern 82 is removed. Thereby as shown in FIG. 9(*c*), the anodes 80 having a specified pattern are formed to the surface of the gel sheet 70.

After the anodes 80 are formed, another gel sheet 70 is released from the release sheet 60, and stacked onto the anodes 80. The anodes 80 are formed to the surface of the stacked gel sheet 70. As shown in FIG. 9(*d*), according to these steps are repeated, the gel actuator having the stacked structure is formed. According to the stacking step is arbitrarily selected, the gel actuator may be formed so as to have the optional stack number.

Also in the case of the method for producing, the thicknesses of the anodes 80 and the gel sheet 70 are easily set to several micrometers to several dozen micrometers. Thereby even if a plurality of the gel actuators is stacked to multilayer, the whole thickness of the stacked structure may be thinned, and the stacked structure may be formed to compact size.

(Connection Structure of Electrode)

Anodes and cathodes of the gel actuators having the stacked structure of the multilayer which is composed of the anodes, the cathodes and gel layers are connected to a positive electrode and a negative electrode of a power source, respectively. In order to connect to the positive electrode and the negative electrode respectively, electrodes for connection are provided on the side faces of the stacked body which are stacked on the anodes, the cathodes and the gel layers. According to this way, the electrodes for connection may be collectively connected.

Figure 10:
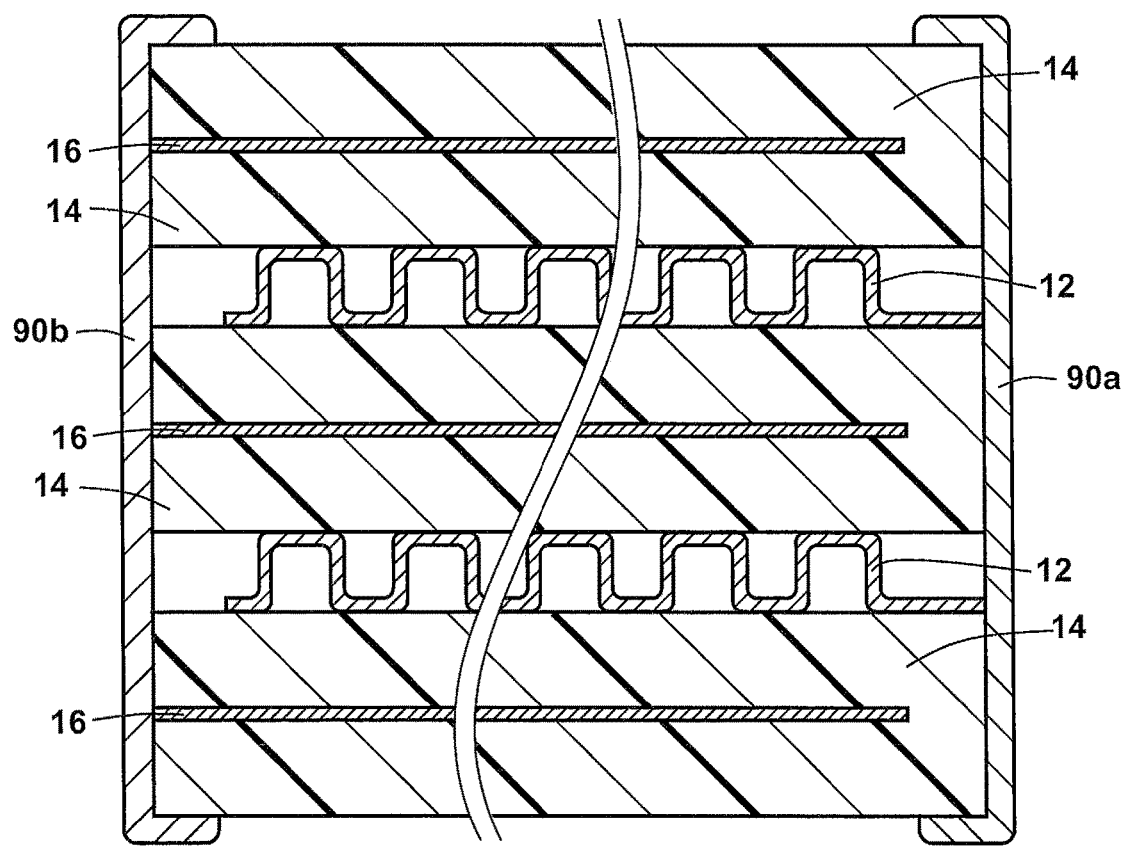
FIG. 10 is a cross-sectional view showing a state in forming electrodes to the gel actuator.

In an example of forming the gel actuator having a rectangle in a planar shape by stacking on anodes 12, gel layers 14, and cathodes 16 having a rectangle in the planar shape, respectively, an example is shown in FIG. 10 that, an electrode 90a connected to the anodes 12 and an electrode 90b connected to the cathodes 16 are provided on side faces of a stacked body.

In order to connect with the electrode 90a and the anodes 12, when the anodes 12, the gel layers 14 and the cathodes 16 are stacked, the anodes 12 and the cathodes 16 are stacked so that the anodes 12 are extended to one side face position of the stacked body, and the cathodes 16 are extended to the other side face position of the stacked body. In this case, the edge of one side of the cathodes 16 are distantly positioned from the edge of one side of the stacked body, and the edge of the other side of the anodes 12 are distantly positioned from the edge of the other side of the stacked body.

When conductor layers are provided so that the edges of one and the other of the stacked body are covered, electrodes 90a, 90b which collectively and electrically connect with all of the anodes 12 and the cathodes 16 of the stacked body may be formed. When the electrodes 90a, 90b are formed, these electrodes need to not short in between the different electrodes, respectively. In order not to expose the edge of one side of the cathodes 16 from the edge of the stacked body, the gel sheet 70 may be formed so that the edge of one side of the cathodes 16 are covered by the gel layers 14. As a forming method of the conductor layer, a method employing conductor foil, conductive film or conductive paste, the plating method, the sputtering method and the like may be utilized.

In the embodiments described above, some methods are explained as the method of producing for the multilayer type gel actuator. According to be employed these methods, as the gel actuator which is stacked on the anodes, the gel layers and the cathodes, the product having 30 μm of the unit structure thickness, 1000 layers of the stack number, 5 V of using voltage, 0.4 MPa of the generation force, 20% of the displacement ratio and 10 Hz of the responsivity may be obtained. The gel actuator may be reduced applied voltage to one-hundredth and may be increased the generation force to 100 times in comparison with a conventional gel actuator (3 μm of the unit structure thickness).

INDUSTRIAL APPLICABILITY

The characteristics described above are comparable to the generation force, the displacement ratio and the responsivity of biological muscle. Therefore, the gel actuator of the present invention may be used to various devices including an actuator for robot as actuators. According to replacing a conventional actuator such a motor etc. to the gel actuator of the present invention, a device may be reduced in size and weight, may be silenced, and may have flexibility. In addition, by driving applied voltage is reduced, even if the gel actuator is used as the actuator of the device which is used while touching human body or at neighborhood thereof, safety may be easily ensured. Thereby, the gel actuator of the present invention may be applied to the device as a massage device, assist suits and the like which is used into the fields of medical and welfare. Further, by the thickness of the unit structure is thinned, the gel actuator itself may be reduced in size. Thus, the gel actuator of the present invention may be used to a mobile terminal etc., for example. Furthermore, according to increase of the generation force, the gel actuator of the present invention may be applied to a large brake and a large clutch etc. which cannot be supplied enough force by the conventional gel actuator.

EXPLANATIONS OF LETTERS OR NUMERALS

Numerals mean as follows. 10: gel actuator, 12: anode, 12a: convex part, 12b: concave part, 13: anode, 13a: conductive layer, 13b: base material, 13c: convex part, 14, 14a, 14b: gel layer, 16: cathode, 16a: conductor layer, 18: power source, 30: substrate, 30a: concave-convex pattern, 40: transfer substrate, 40a: concave-convex pattern, 50: conductor layer, 60: release sheet, 70: gel sheet, 80: anode, 80a: conductor layer, 82: resist pattern, 90a, 90b: electrode

What is claimed is:

1. A gel actuator comprising:
   a unit structure composed of a gel layer containing a dielectric polymer material, and an anode and a cathode which sandwich the gel layer in a thickness direction thereof,
   and in the unit structure, one face of the anode facing the gel layer being formed into a one-side concave-convex face, convex parts of the one-side concave-convex face touching the gel layer, and concave parts of the one-side concave-convex face being formed into a gap into which the gel layer deforming by application of voltage between the anode and the cathode is entered,
   in the unit structure, an other face of the anode being formed into an other-side concave-convex face having other convex parts and other concave parts,
   wherein the anode is formed into a wave shape where the convex parts and the concave parts are alternately continuous in parallel, and
   wherein the convex parts and the concave parts on the one face of the anode respectively correspond to the other concave parts and the other convex parts on the other face thereof so that the gel actuator contracts in the thickness direction.

2. The gel actuator according to claim 1, wherein a plurality of the unit structure is stacked so as to have a configuration avoiding an electrical short.

3. The gel actuator according to claim 2, wherein the gel layers are provided with both faces of the anode, and the cathodes are stacked to the respective gel layers.

4. The gel actuator according to claim 2, wherein the gel layers are provided with both faces of the cathode, and the anodes are stacked to the respective gel layers.

5. The gel actuator according to claim 1, wherein the convex parts and the concave parts are formed into a congruent shape.

6. The gel actuator according to claim 1, wherein the anode is composed of a base material which is made from a non-conductive material and has a concave-convex shape on one face thereof, and the surface of the concave-convex shape thereof is coated with a conductive layer.

* * * * *